United States Patent
Watanabe

(10) Patent No.: US 11,499,992 B2
(45) Date of Patent: Nov. 15, 2022

(54) INSPECTION SYSTEM

(71) Applicant: TOKYO ELECTRON LIMITED, Tokyo (JP)

(72) Inventor: Shinjiro Watanabe, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 195 days.

(21) Appl. No.: 16/695,830

(22) Filed: Nov. 26, 2019

(65) Prior Publication Data

US 2020/0166542 A1  May 28, 2020

(30) Foreign Application Priority Data

Nov. 27, 2018  (JP) .............................. JP2018-221605
Nov. 6, 2019   (JP) .............................. JP2019-201373

(51) Int. Cl.
| | |
|---|---|
| *G01R 1/067* | (2006.01) |
| *G01R 35/00* | (2006.01) |
| *G06N 20/00* | (2019.01) |
| *H04N 5/232* | (2006.01) |

(52) U.S. Cl.
CPC .......... *G01R 1/06794* (2013.01); *G01R 35/00* (2013.01); *G06N 20/00* (2019.01); *H04N 5/23299* (2018.08)

(58) Field of Classification Search
CPC ....................... G01R 1/06794; G01R 31/2891; G01R 35/00; G05B 19/41875; G01D 18/00
USPC ........................................................ 702/58
See application file for complete search history.

(56) References Cited

U.S. PATENT DOCUMENTS

| | | | | |
|---|---|---|---|---|
| 2008/0238463 | A1* | 10/2008 | Takabe ............... | G01R 31/2891 324/762.06 |
| 2021/0124341 | A1* | 4/2021 | Nakasato ............. | G05B 23/024 |
| 2021/0156890 | A1* | 5/2021 | Kobayashi ............... | G01R 1/44 |
| 2022/0026810 | A1* | 1/2022 | Brantjes .................. | G03F 7/705 |

FOREIGN PATENT DOCUMENTS

| | | | |
|---|---|---|---|
| CN | 204177358 | * | 2/2015 |
| JP | 5018183 B2 | | 6/2012 |
| KR | 10-2013-0139726 A | | 12/2013 |

OTHER PUBLICATIONS

English translation of CN 204177358, Feb. 2015. (Year: 2015).*

\* cited by examiner

*Primary Examiner* — Michael P Nghiem
(74) *Attorney, Agent, or Firm* — Nath, Goldberg & Meyer; Jerald L. Meyer; Tanya E. Harkins

(57) ABSTRACT

An inspection system includes a plurality of inspection apparatuses, and a data processing apparatus capable of communicating with the plurality of inspection apparatuses. The data processing apparatus includes a storage part storing a model that determines a causal relationship between an apparatus parameter related to setting of the plurality of inspection apparatuses and index data obtained when the plurality of inspection apparatuses are operated, a collection part collecting the apparatus parameter and the index data, a determination part determining whether or not the index data is included in a predetermined allowable range, and a calculation part calculating an adjustment amount for adjusting the apparatus parameter, based on the apparatus parameter and the index data, and the model, when it is determined that the index data is not included in the predetermined allowable range.

6 Claims, 7 Drawing Sheets

INSPECTION SYSTEM

CROSS-REFERENCE TO RELATED APPLICATIONS

This application is based upon and claims the benefit of priority from Japanese Patent Application Nos. 2018-221605 and 2019-201373, filed on Nov. 27, 2018 and Nov. 6, 2019, respectively, the entire contents of which are incorporated herein by reference.

TECHNICAL FIELD

The present disclosure relates to an inspection system.

BACKGROUND

In a semiconductor device manufacturing process, an inspection apparatus is used to inspect the electrical characteristics of a plurality of devices formed on a semiconductor wafer. The inspection apparatus includes an inspection part on which a probe card having a probe that contacts a device is mounted, a tester for inspecting various electrical characteristics of the device by applying an electrical signal to the device via the probe card, and the like. As a method for improving the accuracy of alignment between the device and the probe in such an inspection apparatus, a method of correcting a contact position is known (see, e.g., Patent Document 1).

PRIOR ART DOCUMENTS

Patent Document

Patent Document 1: Japanese Patent No. 5018183

SUMMARY

According to one embodiment of the present disclosure, there is provided an inspection system including: a plurality of inspection apparatuses; and a data processing apparatus capable of communicating with the plurality of inspection apparatuses, wherein the data processing apparatus comprises: a storage part configured to store a model that determines a causal relationship between an apparatus parameter related to setting of the plurality of inspection apparatuses and index data obtained when the plurality of inspection apparatuses are operated; a collection part configured to collect the apparatus parameter and the index data from at least one of the plurality of inspection apparatuses; a determination part configured to determine whether or not the index data collected by the collection part is included in a predetermined allowable range; and a calculation part configured to calculate an adjustment amount for adjusting the apparatus parameter based on the apparatus parameter and the index data collected by the collection part and the model stored in the storage part, when it is determined by the determination part that the index data is not included in the predetermined allowable range.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
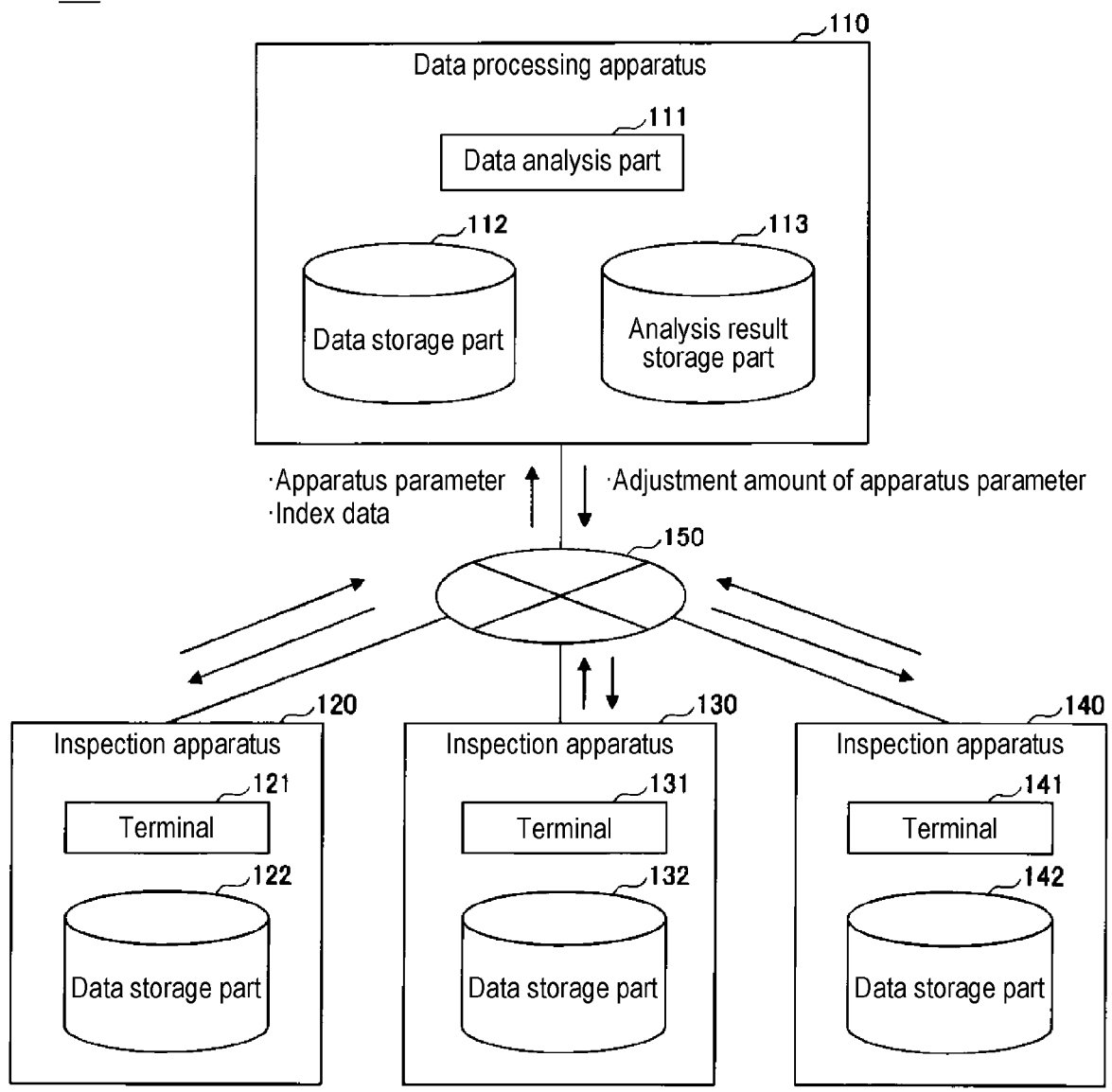
FIG. 1 is a view showing an example of the overall configuration of an inspection system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Throughout the drawings, the same or equivalent parts are denoted by the same reference numerals, and explanation thereof will not be repeated.

[Overall Configuration of Inspection System]

First, the overall configuration of an inspection system will be described. FIG. 1 is a view showing an example of the overall configuration of an inspection system.

As shown in FIG. 1, the inspection system 100 includes a data processing apparatus 110 and inspection apparatuses 120, 130 and 140. The data processing apparatus 110 and the inspection apparatuses 120, 130 and 140 are interconnected to communicate with each other via a network 150.

The data processing apparatus 110 has a data analysis program installed therein, and functions as a data analysis part 111 when the data analysis program is executed.

The data analysis part 111 collects a data group (in the example of FIG. 1, apparatus parameters and index data) from the inspection apparatuses 120, 130 and 140 via the network 150. Further, the data analysis part 111 stores the collected data group in a data storage part 112. A method of collecting the data group is not limited thereto. For example, the data group may be collected by an administrator of the data processing apparatus 110 who collects a recording medium storing the data group from the inspection apparatuses 120, 130 and 140 and the data group may be read from the recording medium. Further, the data analysis part 111 analyzes the data group stored in the data storage part 112 and stores analysis result data in an analysis result storage part 113. Further, the data analysis part 111 transmits the analysis result data (in the example of FIG. 1, the adjustment amount of the apparatus parameter) stored in the analysis result storage part 113 to the inspection apparatuses 120, 130 and 140.

The inspection apparatus 120 includes a terminal 121 constituting the inspection system 100 and a data storage part 122 that stores a data group. The inspection apparatus 120 performs an alignment operation based on the apparatus parameter input from the terminal 121. Further, the inspection apparatus 120 stores the index data obtained by executing the alignment operation in the data storage part 122 in association with the apparatus parameter.

Through the terminal 121, the apparatus parameter to be used when the inspection apparatus 120 executes the alignment operation is input and set in the inspection apparatus 120. In addition, the terminal 121 transmits the data group stored in the data storage part 122 to the data processing apparatus 110. Further, the terminal 121 displays the analysis result data received from the data processing apparatus 110.

The inspection apparatus 130 and the inspection apparatus 140 perform the same alignment operation as the inspection apparatus 120. Therefore, the inspection apparatus 130 and the inspection apparatus 140 may have the same configuration as the inspection apparatus 120. That is, the inspection apparatus 130 includes a terminal 131 and a data storage part 132, and the inspection apparatus 140 includes a terminal 141 and a data storage part 142.

[Configuration of Inspection Apparatus]

Figure 2:
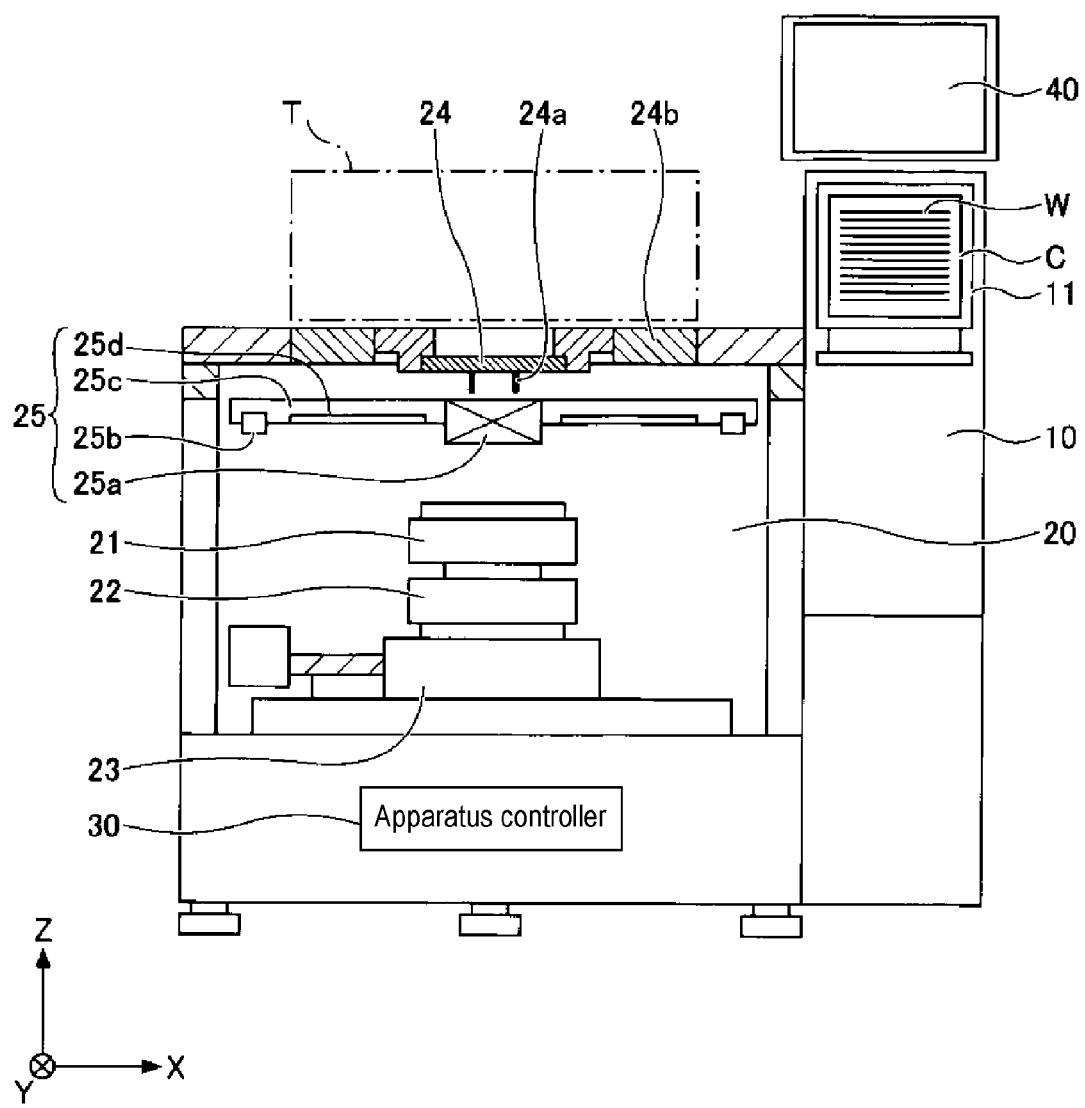
FIG. 2 is a view showing an example of the configuration of an inspection apparatus.

Next, an example of a configuration of the inspection apparatuses 120, 130, and 140 will be described. FIG. 2 is a view showing an example of a configuration of an inspection apparatus. Although the configuration of the inspection apparatus 120 will be described, the inspection apparatuses 130 and 140 have the same configuration as the inspection apparatus 120.

As shown in FIG. 2, the inspection apparatus 120 includes a loader part 10, an inspection part 20 and an apparatus controller 30. Under the control of the apparatus controller 30, the inspection apparatus 120 transfers a semiconductor wafer (hereinafter referred to as a "wafer W"), which is an inspection object, from the loader part 10 to the inspection part 20, and applies an electrical signal to a device to be inspected (DUT: Device Under Test), which is formed on the wafer W, for inspection of various electrical characteristics of the device.

The loader part 10 includes a cassette storage part 11 and a wafer transfer mechanism (not shown).

The cassette storage part 11 stores a cassette C in which wafers W are accommodated. The cassette C is, for example, a FOUP (Front Opening Unify Pod). The wafer transfer mechanism transfers the wafers W between the cassette C stored in the cassette storage part 11 and a stage 21 provided in the inspection part 20 to be described later.

The inspection part 20 is disposed adjacent to the loader part 10. The inspection part 20 includes the stage 21, an elevating mechanism 22, an XY drive mechanism 23, a probe card 24 and an alignment mechanism 25.

The stage 21 places a wafer W on its upper surface. The stage 21 may include a vacuum chuck or an electrostatic chuck. The stage 21 is adjusted to a desired temperature by a temperature adjusting means such as a heating means or a cooling means.

The elevating mechanism 22 is provided below the stage 21 and elevates the stage 21.

The XY drive mechanism 23 is provided below the elevating mechanism 22 and moves the stage 21 and the elevating mechanism 22 in two axial directions (X direction and Y direction in the figure). The XY drive mechanism 23 is fixed to the bottom of the inspection part 20.

The probe card 24 is disposed above the stage 21. A plurality of probes 24a is formed on a portion of the probe card 24 near the stage 21. The probe card 24 is removably attached to a head plate 24b. A tester (not shown) is connected to the probe card 24 via a test head T.

The alignment mechanism 25 includes a camera 25a, a guide rail 25b, an alignment bridge 25c and a light source 25d. The camera 25a is attached downward to the center of the alignment bridge 25c, and takes images of the stage 21, the wafer W and the like. The camera 25a may be a CCD camera or a CMOS camera. The guide rail 25b supports the alignment bridge 25c so as to be movable in the horizontal direction (Y direction in the figure). The alignment bridge 25c is supported by a pair of left and right guide rails 25b, and moves in the horizontal direction (Y direction in the figure) along the guide rails 25b. As a result, the camera 25a moves between a standby position and a position directly below the center of the probe card 24 (hereinafter referred to as a "probe center") via the alignment bridge 25c. The camera 25a located at the probe center takes images of an electrode pad of the wafer W on the stage 21 from above while the stage 21 moves in the XY direction for alignment, performs image processing on the imaged electrode pad, and displays the processed image on a display device 40. The light source 25d is provided below the alignment bridge 25c and irradiates the stage 21 with light.

In the inspection part 20, first, the temperature adjusting means adjusts the temperature of the stage 21 to a desired temperature. Subsequently, the alignment mechanism 25 aligns the electrode pads of the DUT formed on the wafer W on the stage 21 with the plurality of probes 24a of the probe card 24. Subsequently, the elevating mechanism 22 raises the stage 21 and brings the plurality of probes 24a of the probe card 24 into contact with the corresponding electrode pads. Subsequently, the apparatus controller 30 inspects the electrical characteristics of the DUT by applying an inspection signal from the tester to the DUT formed on the wafer W via the test head T and the plurality of probes 24a of the probe card 24.

The apparatus controller 30 is provided below the stage 21 and controls the overall operation of the inspection apparatus 120. A CPU provided in the apparatus controller 30 executes a desired inspection according to a product type parameter stored in a memory such as ROM or RAM. The product type parameter may be stored in a hard disk or a semiconductor memory other than ROM and RAM. The product type parameter may be inserted and read at a predetermined position in a state of being recorded on a computer-readable recording medium such as CD-ROM or DVD.

[Specific Examples of Data Group]

Figure 3:
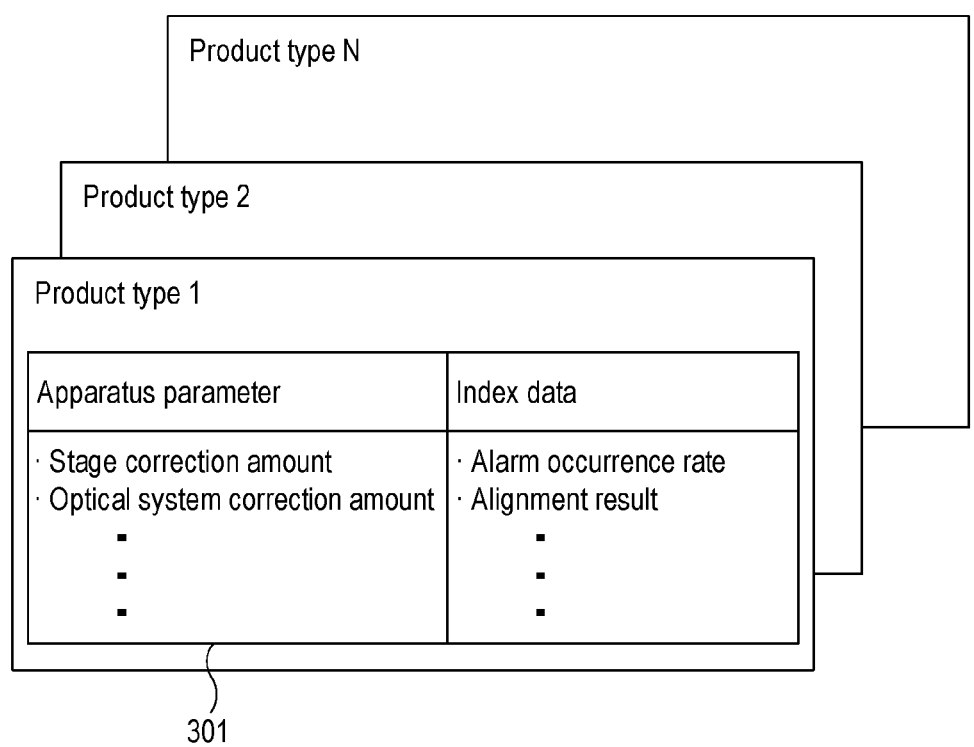
FIG. 3 is a view showing a specific example of a data group handled by the inspection apparatus.

Next, the data groups handled by the inspection apparatuses 120, 130 and 140 will be described. FIG. 3 is a view showing a specific example of the data group handled by an inspection apparatus. Although the data group handled by the inspection apparatus 120 will be described, the data groups handled by the inspection apparatuses 130 and 140 are the same as the data group handled by the inspection apparatus 120.

The inspection apparatus 120 performs a plurality of alignment operations. The plurality of alignment operations is executed based on product type parameters (product type name=product types 1 to N, where N is an integer of 2 or more) set for different types of inspection objects (for example, CPU, memory and so on). In FIG. 3, a data group 301 is a group of data associated with an alignment operation of product type name "product type 1" among the plurality of alignment operations executed by the inspection apparatus 120.

As shown in FIG. 3, the data group 301 includes "apparatus parameter" and "index data" as information items.

The "apparatus parameter" is a parameter related to the setting of the inspection apparatus 120 and is input by the terminal 121. The "apparatus parameter" includes a stage correction amount related to XYZ position correction of the stage 21, an optical system correction amount related to the position and angle of the camera 25a, the illuminance of the light source 25d, and the like.

The "index data" is a parameter obtained when the inspection apparatus 120 is operated, and is generated by the inspection apparatus 120 when the inspection apparatus 120 executes an alignment operation. The "index data" includes an alarm occurrence rate, alignment results related to the accuracy and reproducibility of alignment between a DUT and probes, and the like.

Note that the data group shown in FIG. 3 is an example, and the type of data included in each information item is not limited to that shown in the figure.

[Hardware Configuration of Data processing Apparatus]

Figure 4:
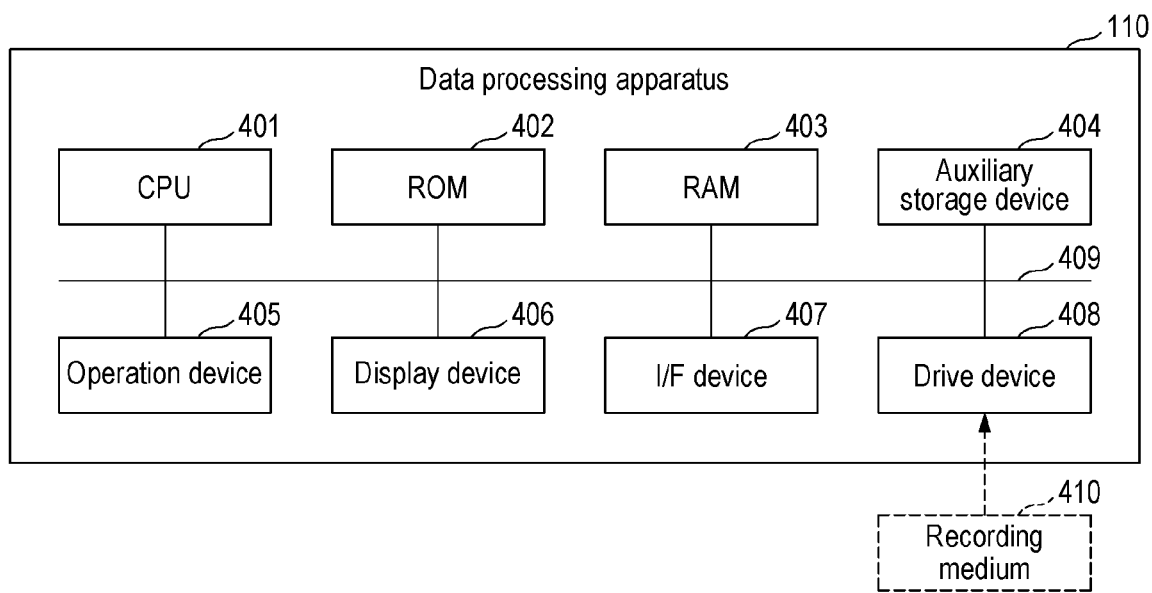
FIG. 4 is a view showing an example of the hardware configuration of a data processing apparatus.

Next, the hardware configuration of the data processing apparatus 110 will be described. FIG. 4 is a view showing an example of the hardware configuration of the data processing apparatus.

As shown in FIG. 4, the data processing apparatus 110 includes a CPU (Central Processing Unit) 401, a ROM (Read Only Memory) 402 and a RAM (Random Access Memory) 403. The CPU 401, the ROM 402 and the RAM 403 form a so-called computer. The data processing apparatus 110 further includes an auxiliary storage device 404, an operation device 405, a display device 406, an I/F (Interface) device 407 and a drive device 408. These components of the data processing apparatus 110 are interconnected via a bus 409.

The CPU 401 executes various programs (for example, a data analysis program and the like) installed in the auxiliary storage device 404.

The ROM 402 is a nonvolatile memory and functions as a main storage device. The ROM 402 stores various programs, data and the like necessary for the CPU 401 to execute the various programs installed in the auxiliary storage device 404. Examples of the various programs may include boot programs such as BIOS (Basic Input/Output System) and EFI (Extensible Firmware Interface).

The RAM 403 is a volatile memory such as DRAM (Dynamic Random Access Memory) or SRAM (Static Random Access Memory), and functions as a main storage device. The RAM 403 provides a work area that is deployed when the various programs installed in the auxiliary storage device 404 are executed by the CPU 401.

The auxiliary storage device 404 stores various programs, a data group collected when the various programs are executed by the CPU 401, and calculated analysis result data. The data storage part 112 and the analysis result storage part 113 are realized in the auxiliary storage device 404.

The operation device 405 is an input device used by an administrator of the data processing apparatus 110 to input various instructions to the data processing apparatus 110. The display device 406 is a display device that displays internal information of the data processing apparatus 110.

The I/F device 407 is a connection device that is connected to the network 150 for communication with each of the inspection apparatuses 120, 130 and 140.

The drive device 408 is a device for inserting a recording medium 410. The recording medium 410 includes a medium that records information optically, electrically or magnetically, such as a CD-ROM, a flexible disk, a magneto-optical disk or the like. The recording medium 410 may further include a semiconductor memory that electrically records information, such as a ROM, a flash memory or the like.

The various programs installed in the auxiliary storage device 404 are installed, for example, in such a way that the distributed recording medium 410 is inserted into the drive device 408 and the various programs recorded on the recording medium 410 are read by the drive device 408. Alternatively, the various programs installed in the auxiliary storage device 404 may be installed by being downloaded via the network 150.

[Functional Configuration of Data Analysis Part of Data Processing Apparatus]

Figure 5:
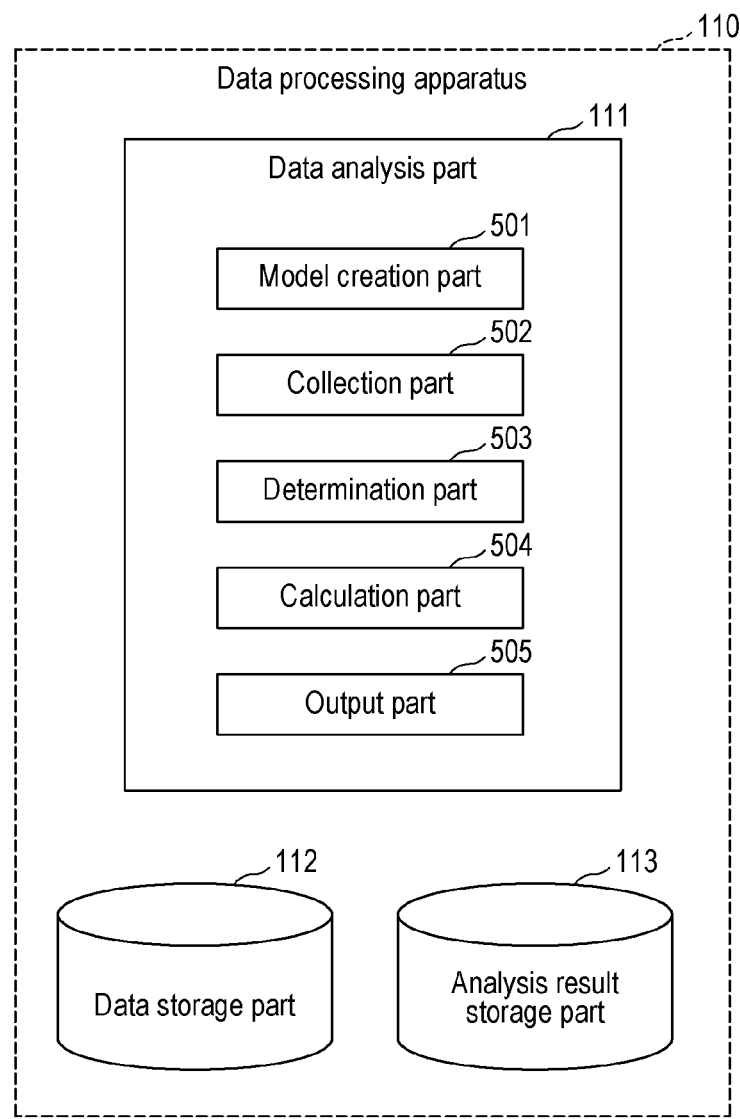
FIG. 5 is a view showing an example of the functional configuration of a data analysis part.

Next, the functional configuration of the data analysis part 111 of the data processing apparatus 110 will be described. FIG. 5 is a view showing an example of the functional configuration of the data analysis part.

As shown in FIG. 5, the data analysis part 111 includes a model creation part 501, a collection part 502, a determination part 503, a calculation part 504 and an output part 505.

The model creation part 501 creates a model that determines the causal relationship between an apparatus parameter and index data based on the data groups (apparatus parameter and index data) obtained from the plurality of inspection apparatuses 120, 130 and 140. An example of the model may include a mathematical formula indicating the degree of contribution of each apparatus parameter to a predetermined alarm occurrence rate. An example of the predetermined alarm occurrence rate may include an alarm occurrence rate which means a position deviation of the stage 21. Examples of the apparatus parameter may include a stage correction amount and an optical system correction amount. The model creation part 501 stores the created model in the analysis result storage part 113.

The collection part 502 collects a data group (for example, the data group 301) from each of the inspection apparatuses 120, 130 and 140 via the network 150. The collection part 502 stores the collected data group in the data storage part 112.

The determination part 503 determines whether or not the index data of the collected data group is included in a predetermined allowable range. The allowable range is, for example, a numerical range set by the administrator for each index data.

Based on the apparatus parameter and the index data of the data group collected by the collection part 502 and the model stored in the analysis result storage part 113, the calculation part 504 calculates an adjustment amount for adjusting the apparatus parameter. The calculation part 504 stores the calculated adjustment amount in the analysis result storage part 113 as a data group, together with the apparatus parameter and the index data.

When the determination part 503 determines that the index data is not included in the allowable range, the output part 505 outputs a warning signal indicating that the inspection apparatus 120 is abnormal. In addition, the output part 505 outputs the apparatus parameter adjustment amount calculated by the calculation part 504.

[Processes of Respective Parts of Data Analysis Part]

(Model Creating Process)

Figure 6:
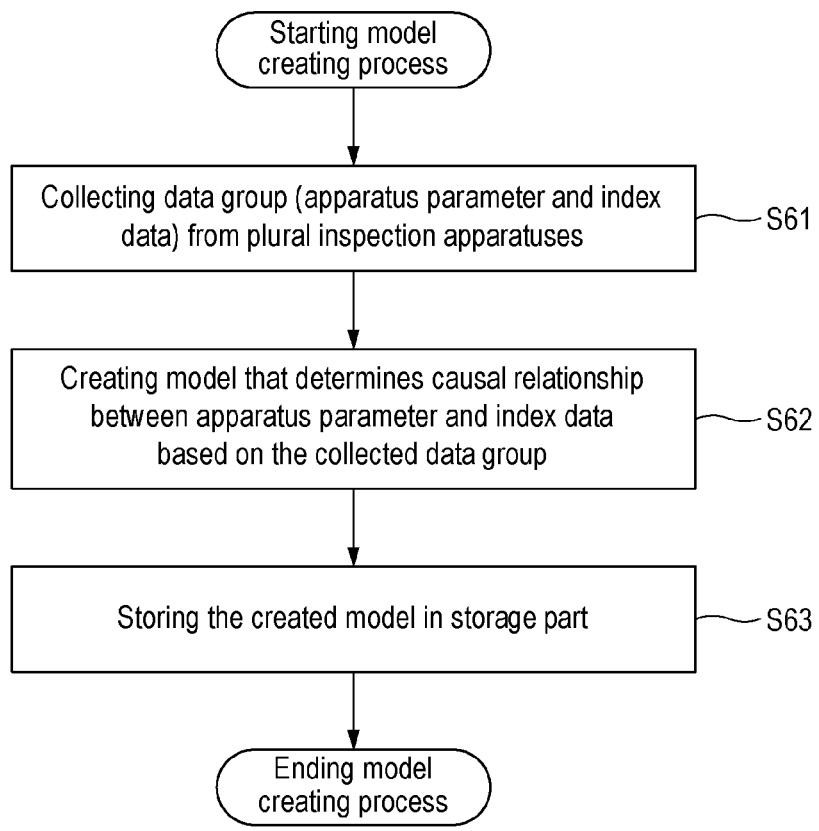
FIG. 6 is a flowchart showing an example of a model creating process.

Next, a model creating process executed by the model creation part 501 and the collection part 502 of the data analysis part 111 will be described. The model creating process is a process of creating a model that determines the causal relationship between the apparatus parameter and the index data based on the apparatus parameter and the index data that are the data group obtained from the plurality of inspection apparatuses 120, 130 and 140. FIG. 6 is a flowchart showing an example of the model creating process.

In step S61, the collection part 502 collects data groups from the plurality of inspection apparatuses 120, 130 and 140. The data group includes an apparatus parameter and index data associated with the apparatus parameter.

In step S62, based on the data group collected by the collection part 502, a model that determines the causal relationship between the apparatus parameter and the index data is created by multivariate analysis or machine learning. An example of the model may include a mathematical formula indicating the degree of contribution of each apparatus parameter to a predetermined alarm occurrence rate. An example of the predetermined alarm occurrence rate may include an alarm occurrence rate which means a position deviation of the stage 21. Examples of the apparatus parameter may include a stage correction amount and an optical system correction amount.

In step S63, the model created by the model creation part 501 is stored in the analysis result storage part 113.

In this manner, in the model creating process, a model that determines the causal relationship between the apparatus parameter and the index data is created based on the data group (apparatus parameter and index data) collected from the plurality of inspection apparatuses 120, 130 and 140.

(Adjustment Amount Calculating Process)

Figure 7:
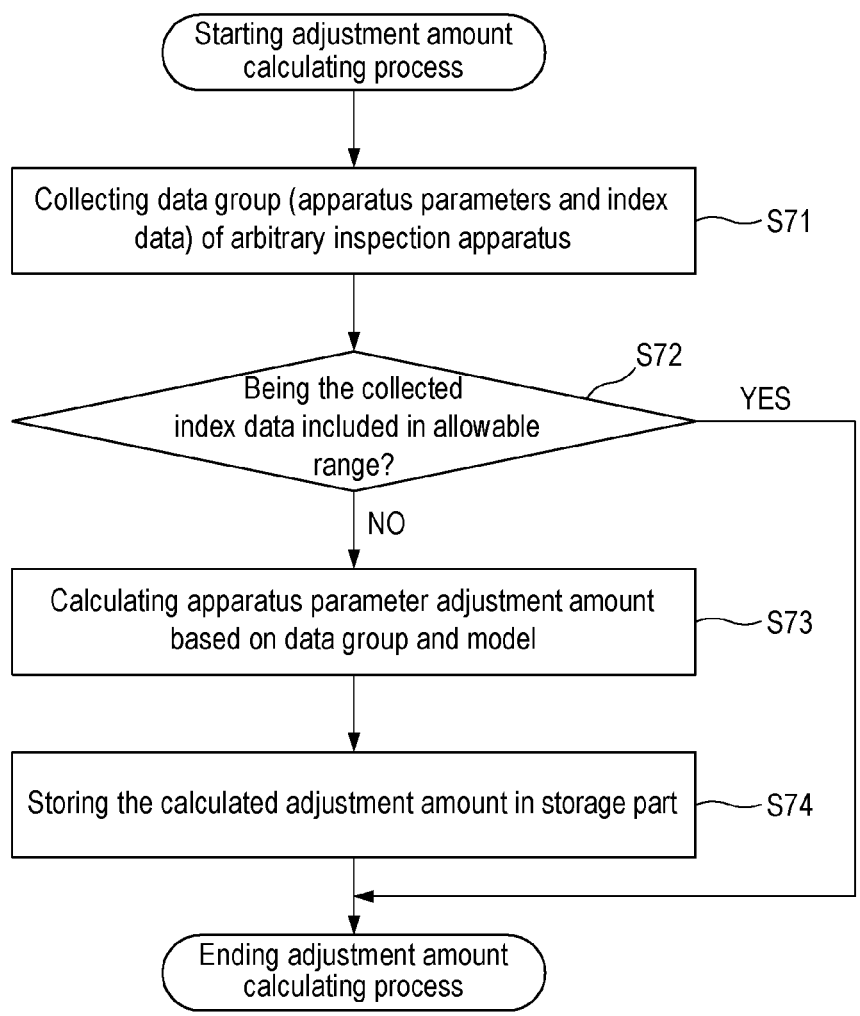
FIG. 7 is a flowchart showing an example of an adjustment amount calculating process.

Next, an adjustment amount calculating process executed by the collection part 502, the determination part 503, the calculation part 504 and the output part 505 of the data analysis part 111 will be described. The adjustment amount calculating process is executed in a state where the model that determines the causal relationship between the apparatus parameter and the index data is stored in the analysis result storage part 113. The model may be, for example, a model created by the model creation part 501 to execute the above-described model creating process, or may be a model read from a recording medium via the drive device 408. FIG. 7 is a flowchart showing an example of the adjustment amount calculating process.

In step S71, the collection part 502 collects a data group 301 of an arbitrary inspection apparatus, for example, the inspection apparatus 120. The data group 301 includes apparatus parameters such as a stage correction amount and an optical system correction amount, and index data such as an alarm occurrence rate and an alignment result.

In step S72, the determination part 503 determines whether or not the index data of the data group 301 collected by the collection part 502 is included in a predetermined allowable range. The allowable range is, for example, a numerical range set by the administrator for each index data. When it is determined in step S72 that the index data is included within the allowable range, the process is ended. On the other hand, when it is determined in step S72 that the index data is not included in the allowable range, the process proceeds to step S73.

In step S73, based on the apparatus parameter and the index data collected by the collection part 502 and the model stored in the analysis result storage part 113, the calculation part 504 calculates an adjustment amount for adjusting the apparatus parameter. An example of the model may include a mathematical formula indicating the degree of contribution of each apparatus parameter (for example, a stage correction amount, an optical system correction amount, etc.) to a predetermined alarm occurrence rate (for example, an alarm occurrence rate due to the positional deviation of the stage 21). Based on the model indicating the contribution of each apparatus parameter to the alarm occurrence rate, which is stored in the analysis result storage part 113, the calculation part 504 calculates an adjustment amount for adjusting a parameter having high contribution to the alarm occurrence rate among the apparatus parameters collected by the collection part 502. The adjustment amount is calculated such that the index data available when the adjusted apparatus parameter is used in the model is included in the predetermined allowable range. In addition, the adjustment amount is also calculated to obtain the index data available when the apparatus parameter is slightly changed. That is, calculation of the adjustment amount is not limited to cases where the adjustment amount is calculated such that the index data is included in the predetermined allowable range.

In step S74, the output part 505 transmits the adjustment amount calculated by the calculation part 504 to the inspection apparatus 120. When the inspection apparatus 120 receives the adjustment amount of the apparatus parameter that is the analysis result data from the data processing apparatus 110, the terminal 121 of the inspection apparatus 120 displays the received apparatus parameter adjustment amount. Accordingly, the administrator can check the apparatus parameter adjustment amount displayed on the terminal 121 and execute adjustment of the corresponding apparatus parameter. In addition, when the apparatus parameter adjustment amount received from the data processing apparatus 110 is an apparatus parameter that can be automatically adjusted, the terminal 121 may automatically adjust the apparatus parameter based on the adjustment amount. Further, the output part 505 may display the apparatus parameter adjustment amount calculated by the calculation part 504 on the display device 406 of the data processing apparatus 110. Further, the output part 505 may output a warning signal indicating that the inspection apparatus 120 is abnormal, together with the adjustment amount. In this case, similarly to the analysis result data, the output part 505 outputs the warning signal to at least one of the terminal 121 of the inspection apparatus 120 and the display device 406 of the data processing apparatus 110.

By the way, conventionally, the administrator regularly checks the state of the inspection apparatus and regularly adjusts the index data so that the index data fall within a preset allowable range. In this environment, it is difficult to perform appropriate maintenance at an appropriate time.

In contrast, according to the inspection system 100, since the data processing apparatus 110 calculates the adjustment amount of the apparatus parameter of each of the inspection apparatuses 120, 130 and 140, appropriate maintenance can be executed at an appropriate time. This makes it possible to increase an alignment success rate in the inspection system 100 including the plurality of inspection apparatuses 120, 130 and 140. In addition, since the inspection apparatus is prevented from being stopped or damaged, the operating rate of the inspection apparatus can be improved and the maintenance cost of the inspection apparatus can be reduced.

In the above embodiments, an inspection apparatus provided with one inspection part for one loader part has been described as an example. However, the present disclosure is not limited thereto. For example, the inspection apparatus may be provided with a plurality of inspection parts for one or more loader parts.

According to the present disclosure in some embodiments, it is possible to increase an alignment success rate in an inspection system including a plurality of inspection apparatuses.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An inspection system comprising:
a plurality of inspection apparatuses; and
a data processing apparatus configured to connect and communicate with the plurality of inspection apparatuses via a network, and including a hardware processor in which a data analysis program is installed,
wherein each inspection apparatus includes:
a terminal to which an apparatus parameter related to setting of the inspection apparatus is inputted; and
a data storage configured to store a data group including the apparatus parameter and index data obtained when the inspection apparatus is operated,
wherein the terminal is further configured to transmit the data group stored in the data storage to the data processing apparatus via the network,
wherein the data processing apparatus comprises:
a data analyzer executed by the hardware processor, and configured to analyze the data group received from the plurality of the inspection apparatuses so as to create analysis result data and transmit the analysis result data to the plurality of the inspection apparatuses,
wherein the data analyzer is further:
configured to receive and collect the apparatus parameter and the index data from at least one of the plurality of inspection apparatuses;
configured to create a model that determines a causal relationship between the apparatus parameter and the index data obtained from the plurality of inspection apparatuses;
configured to determine whether or not the index data collected by the data analyzer is included in a predetermined allowable range;
configured to calculate an adjustment amount for adjusting the apparatus parameter, based on the apparatus parameter and the index data collected by the data analyzer and the model created by the data analyzer, when the data analyzer determines that the index data is not included in the predetermined allowable range; and
wherein the data analyzer includes:
a transmitter configured to transmit the adjustment amount of the apparatus parameter to the inspection apparatus; and
a storage configured to store the model,
wherein upon receiving the adjustment amount of the apparatus parameter from the data processing apparatus, the inspection apparatus is configured to adjust the apparatus parameter based on the adjustment amount and perform inspection operation based on the adjusted apparatus parameter.

2. The inspection system of claim 1, wherein the data analyzer creates the model by multivariate analysis or machine learning.

3. The inspection system of claim 2, wherein the transmitter is further configured to output a warning signal indicating that the inspection apparatus related to the index data not included in the predetermined allowable range is abnormal, when the data analyzer determines that the index data are not included in the predetermined allowable range.

4. The inspection system of claim 3, wherein the apparatus parameter of the inspection apparatus related to the index data not included in the predetermined allowable range is adjusted based on the adjustment amount calculated from the data analyzer.

5. The inspection system of claim 1, wherein the transmitter is further configured to output a warning signal indicating that the inspection apparatus related to the index data not included in the predetermined allowable range is abnormal, when the data analyzer determines that the index data are not included in the predetermined allowable range.

6. The inspection system of claim 1, wherein the apparatus parameter of the inspection apparatus related to the index data not included in the predetermined allowable range is adjusted based on the adjustment amount calculated from the data analyzer.

* * * * *